(12) United States Patent
Jung

(10) Patent No.: US 7,741,667 B2
(45) Date of Patent: Jun. 22, 2010

(54) CMOS IMAGE SENSOR FOR IMPROVING THE AMOUNT OF LIGHT INCIDENT A PHOTODIODE

(75) Inventor: Sun Wook Jung, Suncheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 232 days.

(21) Appl. No.: 11/517,890

(22) Filed: Sep. 8, 2006

(65) Prior Publication Data

US 2007/0051992 A1 Mar. 8, 2007

(30) Foreign Application Priority Data

Sep. 8, 2005 (KR) .................. 10-2005-0083669

(51) Int. Cl.
*H01L 31/062* (2006.01)
(52) U.S. Cl. .............. 257/294; 257/E31.121; 438/70
(58) Field of Classification Search ......... 257/290–294, 257/E31.121, E31.123; 437/70, 75
See application file for complete search history.

(56) References Cited

U.S. PATENT DOCUMENTS

| 6,979,588 B2 * | 12/2005 | Jeong et al. | 438/70 |
| 7,193,289 B2 * | 3/2007 | Adkisson et al. | 257/431 |
| 7,339,155 B2 * | 3/2008 | Lee | 250/214.1 |
| 7,342,268 B2 * | 3/2008 | Adkisson et al. | 257/291 |
| 2005/0253212 A1 * | 11/2005 | Nam et al. | 257/432 |
| 2006/0113622 A1 * | 6/2006 | Adkisson et al. | 257/443 |
| 2006/0138480 A1 * | 6/2006 | Adkisson et al. | 257/291 |

FOREIGN PATENT DOCUMENTS

| CN | 20041097031 | 6/2005 |
| JP | 2004-000943 | 7/2005 |
| KR | 10-2000-0086312 | 7/2002 |
| KR | 10-2003-0068503 | 4/2005 |

* cited by examiner

*Primary Examiner*—David Vu
(74) *Attorney, Agent, or Firm*—Saliwanchik, Lloyd & Saliwanchik

(57) ABSTRACT

Provided are a CMOS image sensor and a fabricating method thereof. The CMOS image sensor includes a device isolation layer, a plurality of photodiode regions, an interlayer insulating layer, a refracting layer, a planarizing layer, a color filter layer, and a plurality of microlenses. The refracting layer, with a higher refractive index than that of the interlayer insulating layer, is formed through the interlayer insulating layer on portions of the device isolation layer, to divide the interlayer insulating layer and give the divided portions thereof the characteristics of a waveguide.

9 Claims, 4 Drawing Sheets

CMOS IMAGE SENSOR FOR IMPROVING THE AMOUNT OF LIGHT INCIDENT A PHOTODIODE

RELATED APPLICATION

This application claims the benefit under 35 U.S.C. §119 (e), of Korean Patent Application Number 10-2005-0083669 filed Sep. 8, 2005, which is incorporated herein by reference in its entirety.

FIELD OF THE INVENTION

The present invention relates to an image sensor and a method of fabricating the same, and more particularly, to a complementary metal oxide semiconductor (CMOS) image sensor capable of preventing loss of light reaching a photodiode, while reducing interference between light waves, and a method of fabricating the CMOS image sensor.

BACKGROUND OF THE INVENTION

In general, an image sensor is a semiconductor device that converts an optical image into an electrical signal. Image sensors can largely be divided into charge coupled devices (CCD) and CMOS image sensors.

Using CMOS fabricating technology, a CMOS image sensor can be fabricated using a simple fabrication process that consumes a relatively small amount of power and consists of a comparatively small number of photo processing steps.

Also, because a control circuit, signal processing circuit, analog/digital conversion circuit, etc. can be integrated into one CMOS image sensor chip, the product can be easy to miniaturize.

FIG. 1 is a sectional view of a CMOS image sensor according to the related art.

Referring to FIG. 1, a p-type epitaxial layer 11 is grown on a p-type semiconductor substrate 10 divided into device isolation regions and active regions. A device isolation layer 12 is formed on the device isolation regions of the semiconductor substrate 10, so that the active regions are divided into a first, second, and third n-type region 13, 14, and 15 by the device isolation layer 12.

Here, the first, second, and third n-type regions 13, 14, and 15 are photodiode regions.

Then, gate electrodes 17 are formed on the active regions of the semiconductor substrate 10 with a gate insulating layer 16 interposed therebetween. Insulating layer sidewalls 18 are formed on the sides of the gate electrodes 17, and an interlayer insulating layer 19 is formed on the entire surface of the semiconductor substrate 10 including the gate electrodes 17.

A first planarizing layer 20 is formed on the interlayer insulating layer 19, and a blue, green, and red color filter layer 21 is formed on the first planarizing layer 20 with color segments corresponding to the first, second, and third n-type regions 13, 14, and 15.

Also, a second planarizing layer 22 is formed on the entire surface of the semiconductor substrate 10 including each of the color segments in the color filter layer 21, and microlenses 23 corresponding to each color segment are formed on the second planarizing layer 22.

In the CMOS image sensor according to the related art having the above configuration, light is incident through each color segment of the color filter layer 21 on the corresponding first, second, and third n-type region 13, 14, and 15 (or the photodiode region).

However, the light that passes the blue, green, and red color segments can interfere with neighboring color segments, inducing a loss in the quantity of light that is focused on the photodiodes through dispersion and diffraction of the light passing through the segments of the color filter.

SUMMARY OF THE INVENTION

Accordingly, the present invention is directed to a CMOS image sensor and a fabricating method thereof that addresses and/or substantially obviates one or more problems, limitations, and/or disadvantages of the related art.

An object of the present invention is to provide a CMOS image sensor that prevents interference between color segments of color filter arrays and also prevents a loss in the quantity of light focused on the photodiodes, and a fabricating method of the CMOS image sensor.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CMOS image sensor including: a device isolation layer formed on device isolation regions of a semiconductor substrate; a plurality of photodiode regions formed in active regions of the semiconductor substrate at a predetermined interval and isolated by the device isolation layer; an interlayer insulating layer formed on an entire surface of the semiconductor substrate; a refracting layer passing through the interlayer insulating layer and formed on portions of the device isolation layer such that the interlayer insulating layer has a characteristic of a waveguide; a planarizing layer formed on an entire surface of the semiconductor substrate including the refracting layer; a color filter layer formed on the planarizing layer and including a plurality of color segments corresponding respectively to the photodiode regions; and a microlens formed respectively on each color segment of the color filter layer.

In another aspect of the present invention, there is provided a method of fabricating a CMOS image sensor, including: forming a device isolation layer on device isolation regions of a semiconductor substrate; forming a plurality of photodiode regions in active regions of the semiconductor substrate at a predetermined interval and each photodiode region being isolated by the device isolation layer; forming an interlayer insulating layer on an entire surface of the semiconductor substrate; selectively removing the interlayer insulating layer to form a plurality of holes for exposing predetermined portions of a surface of the device isolation layer; forming a refracting layer in each of the holes; forming a planarizing layer on an entire surface of the semiconductor substrate including the refracting layer; forming a color filter layer on the planarizing layer, the color filter layer including a plurality of color segments corresponding respectively to the photodiode regions; and forming a microlens respectively on each color segment of the color filter layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to a CMOS image sensor and a method of fabricating the same, according to preferred embodiments of the present invention, examples of which are illustrated in the accompanying drawings. Wherever possible, the same reference numbers will be used throughout the drawings to refer to the same or like parts.

Figure 1:
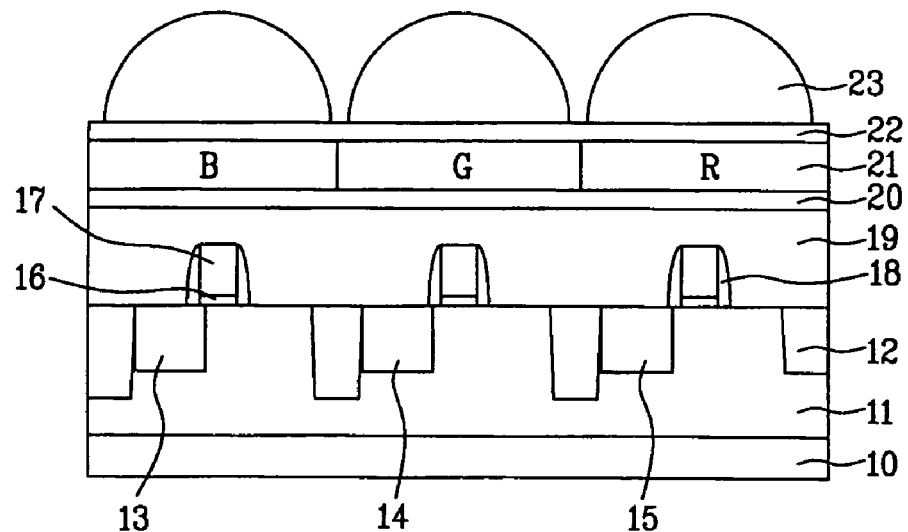
FIG. 1 is a sectional view of a CMOS image sensor according to the related art.
Figure 2:
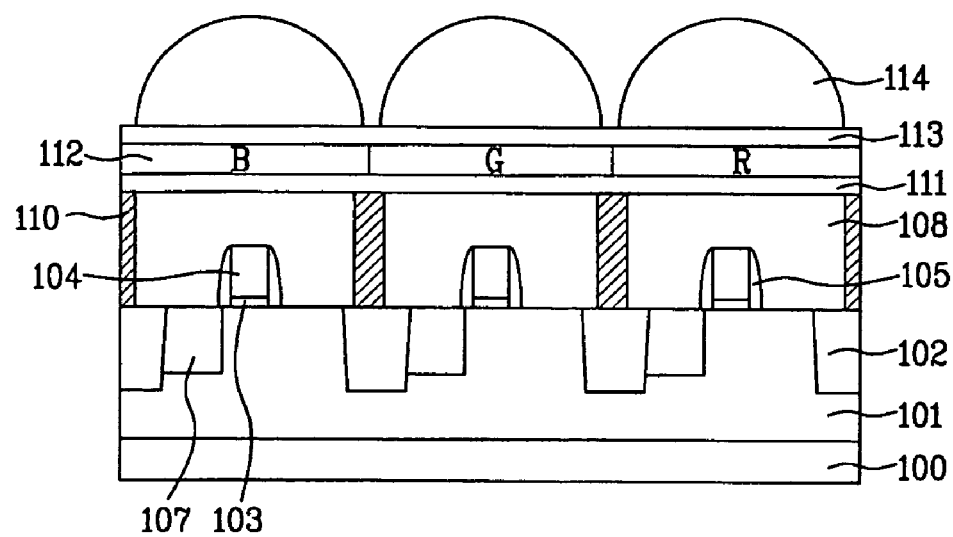
FIG. 2 is a sectional view of a CMOS image sensor according to an embodiment of the present invention.

FIG. 2 is a sectional view of a CMOS image sensor according to an embodiment of the present invention.

Referring to FIG. 2, a p-type epitaxial layer 101 can be formed on a p-type semiconductor substrate 100 having device isolation regions and active regions. A device isolation layer 102 can be formed on the device isolation regions of the semiconductor substrate 100, and gate electrodes 104 can be formed on the active regions of the semiconductor substrate 100 with a gate insulating layer 103 interposed therebetween. Insulating layer sidewalls 105 can be formed on the sides of gate electrodes 104. A plurality of n-type diffusion regions 107 can be formed on the active regions of the semiconductor substrate 100 at predetermined intervals, an interlayer insulating layer 108 is formed on the entire surface of the semiconductor substrate 100 including the gate electrodes 104, and a refractive layer 110 can be formed through the interlayer insulating layer 108 on portions of the device isolation layer 102. A first planarizing layer 111 can be formed on the entire surface of the semiconductor substrate 100 including the refracting layer 110 and the interlayer insulating layer 108. A blue, green, and red color filter layer 112 can be formed on the first planarizing layer 111 with color segments corresponding to the n-type diffusion regions. A second planarizing layer 113 can be formed on the entire surface of the semiconductor substrate 100 including each of the color segments of the color filter layer 112, and a plurality of microlenses 114 can be formed on the second planarizing layer 113 corresponding to each color segment of the color filter layer 112.

In the above structure, the interlayer insulating layer 108 can be divided by a plurality of refracting layer 110 portions. Because the refractive index of the refracting layer 110 is greater than that of the interlayer insulating layer 108, incident light can pass between the portions of the refracting layer 110 through the interlayer insulating layer 108. Accordingly, the portions of the refracting layer 110 and the interlayer insulating layer 108 form a plurality of waveguides.

The portions of the interlayer insulating layer 108 divided by the refracting layer 110 correspond to each of the R, G, B color segments of the color filter layer 112, and the light passing through the color filter layer is transmitted through the interlayer insulating layer 108 onto the photodiodes including the gate electrodes 104.

Here, the portions of the refracting layer 110 correspond to boundaries of each color segment in the color filter layer 112.

FIGS. 3A through 3G are sectional views showing the different fabrication stages of a CMOS image sensor according to an embodiment of the present invention.

Figure 3A:
FIGS. 3A through 3G are sectional views showing the different fabrication stages of a CMOS image sensor according to an embodiment of the present invention.

Referring to FIG. 3A, an epitaxial process can be performed on a $p^{++}$ type semiconductor substrate 100 to form a $p^-$ epitaxial layer 101. In a specific embodiment, a single crystal silicon substrate may be used as the semiconductor substrate 100.

Figure 3B:
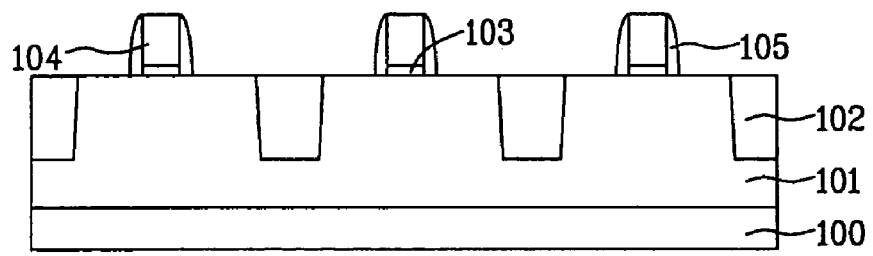

Referring to FIG. 3B, a device isolation layer 102 can be formed on device isolation regions of the semiconductor substrate 100 to define active regions. In one embodiment, the device isolation layer 102 can be formed through a shallow trench isolation (STI) process or a local oxidation of silicon (LOCOS) process.

Next, a gate insulating layer 103 and a material layer for a gate electrode can be deposited on the epitaxial layer 101, and photo and etching processing can be used to selectively remove the material layer and the gate insulating layer 103 so that gate electrodes 104 are formed on the active regions defined by the device isolation layer 102.

The material layer used for the gate electrodes can be a polysilicon layer or a metal layer. In a specific embodiment, the material layer can have a thickness of approx. 2000-3000 Å.

The gate electrodes 104 are transfer transistor gate electrodes. Gate electrodes forming unit pixels (not shown) can also be formed during the same processes.

Then, after an insulating layer is deposited on the entire surface of the semiconductor substrate 100 including the gate electrodes 104, an etchback process can be performed on the entire surface to form insulating layer sidewalls 105 at the sides of each gate electrode 104.

Figure 3C:
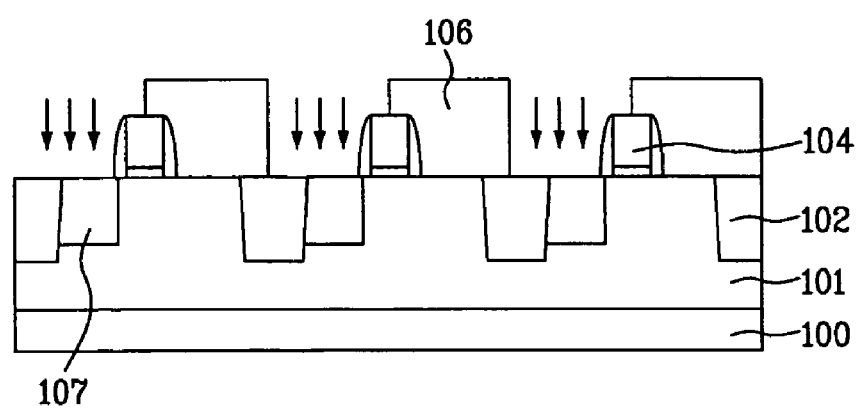

Referring to FIG. 3C, after a photoresist is deposited on the entire surface of the semiconductor substrate 100 including the gate electrodes 104, the photoresist 106 can be patterned through exposing and developing processes to define photodiode regions.

Next, the patterned photoresist 106 can be used as a mask, and ion implantation of an n-type impurity can be performed on the entire surface of the semiconductor substrate 100 to form n-type diffusion regions 107 on the photodiode regions.

Figure 3D:
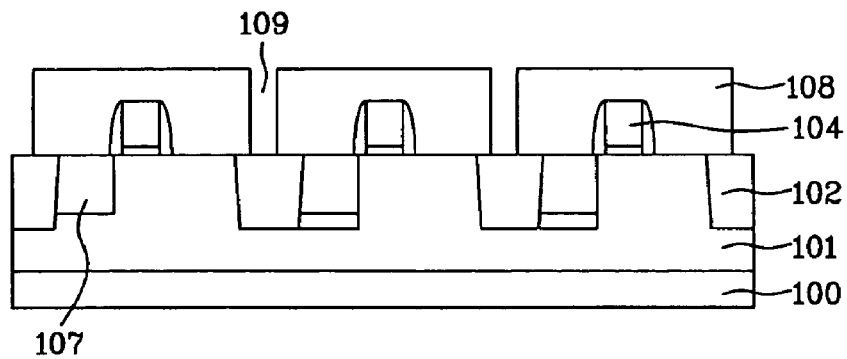

Referring to FIG. 3D, after the photoresist 106 is removed, an interlayer insulating layer 108 can be formed on the entire surface of the semiconductor substrate 100, and holes 109 can be formed by selectively removing the interlayer insulating layer 108 through photo and etching processes to expose predetermined portions of the device isolation layer 102.

In one embodiment, the interlayer insulating layer 108 can incorporate an oxide layer such as undoped silicate glass (USG).

Figure 3E:
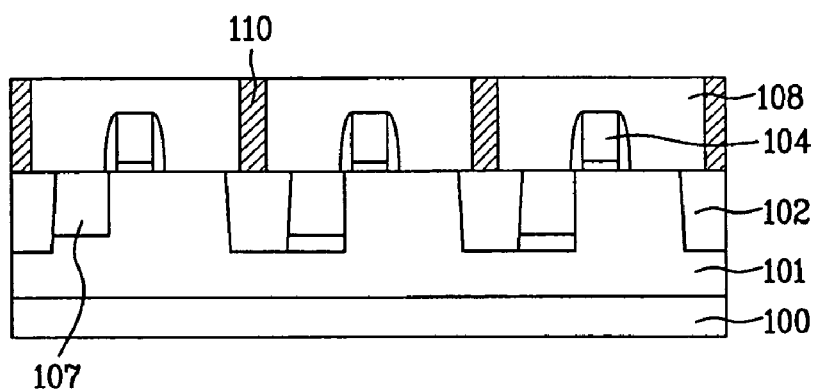

Referring to FIG. 3E, a multi-refractive thin film can be formed on the entire surface of the semiconductor substrate including in the holes 109. Then, an etchback, CMP, or other planarizing process can be performed to form a refracting layer 110 inside the holes 109.

Here, the refracting layer 110 is a region having a higher refractive index than that of the interlayer insulating layer 108, so that the path of light transmission has reduced refractive angles within the regions filled with the interlayer insulating layer 108, thereby increasing incidence on the photodiode regions. That is, a waveguide is formed for each portion of the interlayer insulating layer 108 divided by the refracting layer 110. This is so that the incident light transmitted through the color filter layer is reflected by the refracting layer 110 (that has a higher refractive index than that of the interlayer insulating layer 108) and is focused and transmitted through the portions of the interlayer insulating layer 108 disposed between the portions of the refracting layer 110. In a further embodiment, the refracting layer 110 may be formed as a plurality of refracting layers.

When the interlayer insulating layer 108 incorporates USG, which has a refractive index of approx. 1.2, the refracting layer 110 should have a refractive value greater than 1.2.

In preferred embodiments, the multi-refractive thin film can be formed of a nitride layer, an oxide-based material, or an opaque metal layer.

Figure 3F:
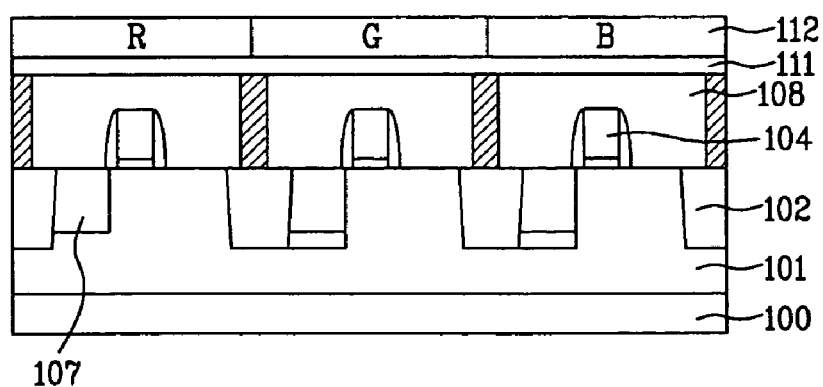

Referring to FIG. 3F, a first planarizing layer 111 can be formed on the entire surface of the semiconductor substrate 100 including the refracting layer 110. Then, a dyed resist layer with blue, green, and red color segments can be deposited on the first planarizing layer 111, and an R, G, B color filter layer 112 for filtering respective ranges of light wavelengths can be formed through exposing and developing processes.

Figure 3G:
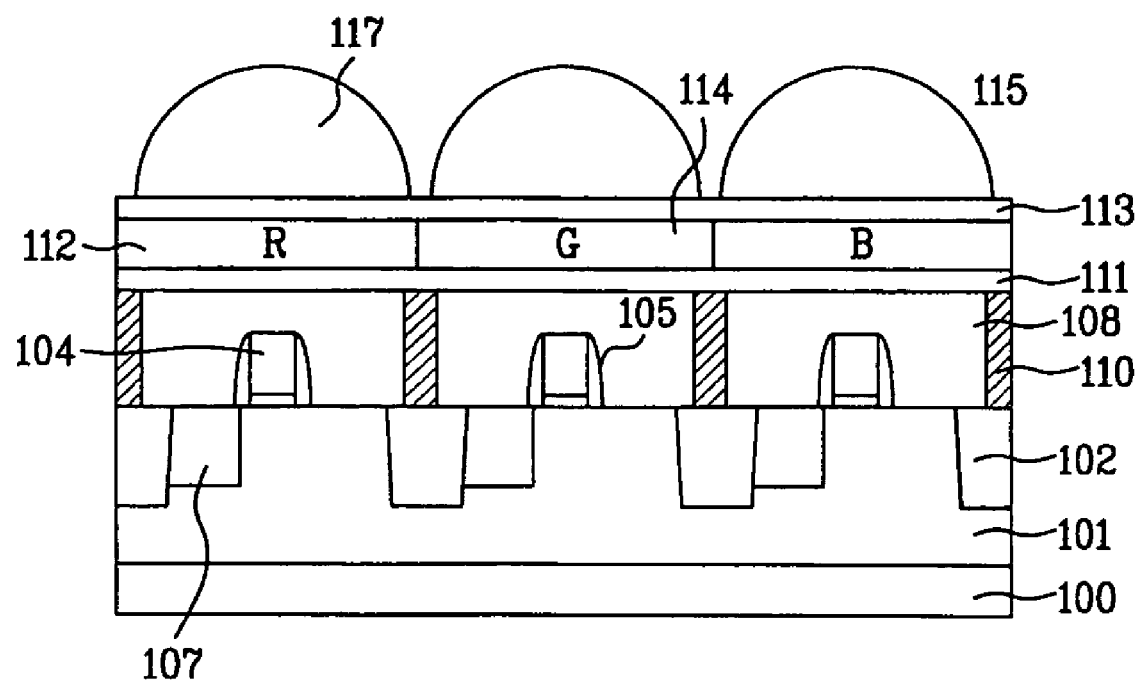

Referring to FIG. 3G, a second planarizing layer 113 can be formed on the semiconductor substrate 100 including the color filter layer 112, and a material for forming microlenses can be deposited on the second planarizing layer 113.

Then, the material for forming microlenses can be selectively patterned, and the patterned material is then reflowed to form a microlens 114 corresponding to each color segment of the color filter layer 112.

In a specific embodiment, the material used for forming the microlenses can be an oxide layer, such as a resist or a TEOS.

The above-described CMOS image sensor and the fabrication method thereof have the following benefits.

By forming a waveguide between each color filter segment, interference occurring between adjacent color filter segments can be prevented, while the amount of light incident on the photodiodes can be increased to improve the sensitivity of the image sensor.

It will be apparent to those skilled in the art that various modifications and variations can be made in the present invention. Thus, it is intended that the present invention covers the modifications and variations of this invention provided they come within the scope of the appended claims and their equivalents.

I claim:

1. A CMOS (complementary metal oxide semiconductor) image sensor comprising:
    a semiconductor substrate having device isolation regions and active regions;
    a device isolation layer formed on the device isolation regions of the semiconductor substrate;
    gate electrodes formed on the active regions;
    a plurality of photodiode regions formed at a predetermined interval in the active regions and each photodiode region with at least one gate electrode of the gate electrodes isolated by the device isolation layer;
    an interlayer insulating layer formed above an entire surface of the semiconductor substrate;
    a refracting layer passing through the interlayer insulating layer and formed directly on portions of the device isolation layer, wherein the interlayer insulating layer and the refracting layer perform as a waveguide, wherein the refracting layer has a greater refractive index than the interlayer insulating layer;
    a planarizing layer formed on an entire surface of the semiconductor substrate including the refracting layer;
    a color filter layer formed on the planarizing layer and including a plurality of color segments corresponding respectively to the photodiode regions; and
    a microlens formed respectively on each color segment of the color filter layer,
    wherein the planarizing layer includes a level upper surface and is disposed between the color filter layer and the refracting layer,
    wherein the refracting layer is directly contacted with the planarizing layer and is disposed below the color filter layer at a region corresponding to a boundary of each color segment.

2. The CMOS image sensor according to claim 1, wherein the refracting layer is selected from the group consisting of: a nitride layer, an oxide-based material, and an opaque metal layer.

3. The CMOS image sensor according to claim 1, wherein the refracting layer has a higher refractive index than a refractive index of the interlayer insulating layer.

4. The CMOS image sensor according to claim 1, wherein the interlayer insulating layer is a oxide layer.

5. The CMOS image sensor according to claim 1, wherein the refracting layer divides the interlayer insulating layer into segments, wherein the divided segments of the interlayer insulating layer correspond respectively to the color segments of the color filter layer.

6. The CMOS image sensor according to claim 1, wherein the refracting layer divides the interlayer insulating layer into segments, wherein the divided segments of the interlayer insulating layer have waveguide characteristics for guiding light incident through the color filter layer.

7. The CMOS image sensor according to claim 1, wherein the refracting layer is a nitride layer.

8. The CMOS image sensor according to claim 1, wherein the refracting layer is a oxide-based material.

9. The CMOS image sensor according to claim 1, wherein the refracting layer is formed on portions of the device isolation layer at pixel borders.

\* \* \* \* \*